United States Patent
Wang et al.

(10) Patent No.: US 6,277,709 B1
(45) Date of Patent: Aug. 21, 2001

(54) METHOD OF FORMING SHALLOW TRENCH ISOLATION STRUCTURE

(75) Inventors: Yin-Pin Wang, Kaohsiung; Chung-Ju Lee, Hsinchu Hsien; Wen-Jya Liang, Hsinchu; Jhy-Weei Hsia, Taipei Hsien; Fu-Liang Yang, Tainan; Yuh-Sheng Chern, Hsinchu, all of (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/628,214

(22) Filed: Jul. 28, 2000

(51) Int. Cl.<sup>7</sup> ...................................... H01L 21/76
(52) U.S. Cl. ........................ 438/430; 438/435; 438/437
(58) Field of Search .................... 438/430, 435, 438/437

(56) References Cited

U.S. PATENT DOCUMENTS 5,099,304 * 3/1992 Takemura et al. .
5,316,978 * 5/1994 Boyd et al. .
5,994,200 * 11/1999 Kim ...................................... 438/425

* cited by examiner

Primary Examiner—Long Pham
(74) Attorney, Agent, or Firm—Jiawei Huang; J. C. Patents

(57) ABSTRACT

A method for manufacturing a shallow trench isolation structure. A pad oxide layer and a mask layer are formed over a substrate. Portions of the mask layer, the pad layer and substrate are removed forming a trench. Oxidation of the substrate within the trench forms a linear oxide layer. The substrate at the bottom of the trench is exposed by removing a portion of the linear oxide layer at the bottom of the trench. A polysilicon layer, deposited completely over the mask, fills the trench as well. The polysilicon layer on the mask layer and outside the trench is removed, leaving polysilicon within the trench, which forms a polysilicon plug. A thin conformal barrier layer is formed over the substrate. An insulator layer is deposited above the barrier layer. The isolation layer and barrier layer on top of the mask as well as outside the trench are removed using a chemical mechanical polishing method. The mask is removed.

12 Claims, 3 Drawing Sheets

METHOD OF FORMING SHALLOW TRENCH ISOLATION STRUCTURE

BACKGROUND OF THE INVENTION

1. Field of the Invention

The present invention relates to a method of manufacturing an isolation of integrated circuits. More particularly, the present invention relates to a method for manufacturing a shallow trench isolation.

2. Description of the Related Art

A complete integrated circuit is composed of a plurality of metal oxide semiconductor (MOS) transistors. Device isolation structures are used for isolating neighboring semiconductor devices so that any short circuiting between them is prevented. The conventional method of isolating semiconductor devices includes forming a field oxide (FOX) layer on a substrate by local oxidation of silicon (LOCOS). However, the field oxide layer that is formed has several problems. Considerable stresses are created at the junction between the field oxide layer and the substrate. Moreover, bird's beak regions are created around the periphery of the isolation structure. Consequently, IC devices that use (FOX) isolation structures are less amenable to high-density packing.

Shallow trench isolation is another method for isolating semiconductor devices. Shallow trench isolation entails the following procedures. First an anisotropic etching operation is conducted to form a trench in the semiconductor substrate. The trench is subsequently filled with silicon oxide. Since shallow trench isolation can prevent bird's beak encroachment, associated with the LOCOS method, it is an ideal method for forming deep sub-micron devices.

FIGS. 1A through 1C are schematic cross-sectional views showing the progression of steps for producing a conventional shallow trench isolation structure.

As shown in FIG. 1, a pad oxide layer 102 and a silicon nitride layer 104 are formed over the substrate 100. Using the silicon nitride layer 104 as an etching mask, a trench 106 is etched in the substrate 100. A linear oxide layer 108 is formed on the surface of the exposed portion of the substrate 100. A silicon oxide layer 110 is formed above the substrate 100, covering the silicon nitride layer 104 and filling the trench 106.

As shown in FIG. 1B, the silicon nitride layer 104 is used as a polishing stop layer to carry out a chemical mechanical polishing operation to remove excess silicon oxide layer and leave the silicon oxide layer 110 within the trench 106.

As shown in FIG. 1C, the silicon nitride layer 104 is removed. Through the application of hydrofluoric acid the pad oxide layer 102 is subsequently removed, leaving the isolation region formed by the silicon oxide layer 100 in the trench 106.

The size of devices and shallow trench isolation structures must be reduced, in order to enable higher levels of integration among high-density integrated circuits. In order to assure the effective isolation of devices, a predetermined width for shallow trench isolation structures must be established. Raising the concentration leads to a reduction in the surface area of the trench. A reduction in surface area of the trench increases the aspect ratio of the trench and, as a consequence, makes filling the trench more difficult. Specifically, if isolation material is not applied properly, then voids will formed within the shallow trench isolation structure.

SUMMARY OF THE INVENTION

Accordingly, one objective of this invention is to provide a method of manufacturing a shallow trench isolation structure that lowers the aspect ratio of a trench, facilitate the filling of the trench with isolation material, and thus enhance the effectiveness of the isolation structure.

As embodied and broadly described herein, the invention provides a method of manufacturing a shallow trench isolation structure. A pad oxide layer and a mask layer are sequentially formed over a substrate. Through a lithographic and etching procedure, portions of the mask layer, the pad oxide layer, and the substrate are removed forming a trench. The oxidation step is performed to cause the substrate within the trench to form a linear oxide layer. The linear oxide layer on the bottom of the trench is removed to expose the bottom of the trench. A polysilicon layer, deposited over the surface of the wafer, covers the mask layer and fills the trench. An etching procedure is used to remove the polysilicon layer higher than the mask layer. The remaining portion of the polysilicon layer within the trench forms a polysilicon plug. A thin, conformal barrier layer is subsequently deposited over the substrate. An isolation layer is then deposited over the barrier layer. A chemical mechanical polishing procedure is then conducted to remove insulating material as well as the barrier layer on top of the mask layer and outside the trench. The mask layer is removed.

The method of manufacturing shallow trench isolation structures provided in this invention lowers the aspect ratio of the trench used to fill the isolation layer. Consequently, difficulties associated with filling the trench are reduced.

Oxidation of polysilicon used to fill the trench may occur in subsequent stages of the process. The silicon dioxide, formed as a result of oxidation, possesses greater volume. This change in volume produces a great deal of stress on the device and affects its performance. Thus, the method of this invention provides a barrier layer covering the polysilicon layer. Thereafter, a isolation layer is formed thereon. In this way, further oxidation of the polysilicon layer can be avoided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

Figure 1A:
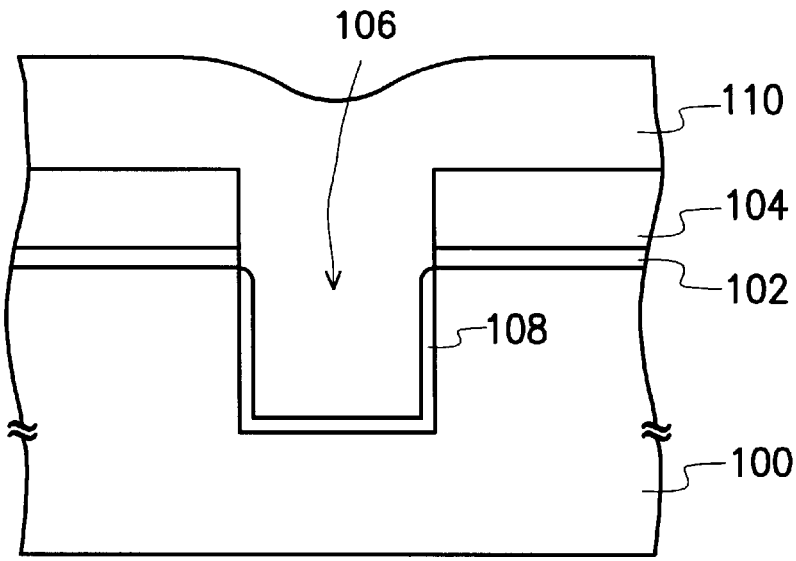
FIGS. 1A through 1C are schematic cross-sectional views showing the progression of steps for producing a conventional shallow trench isolation structure.
Figure 1B:
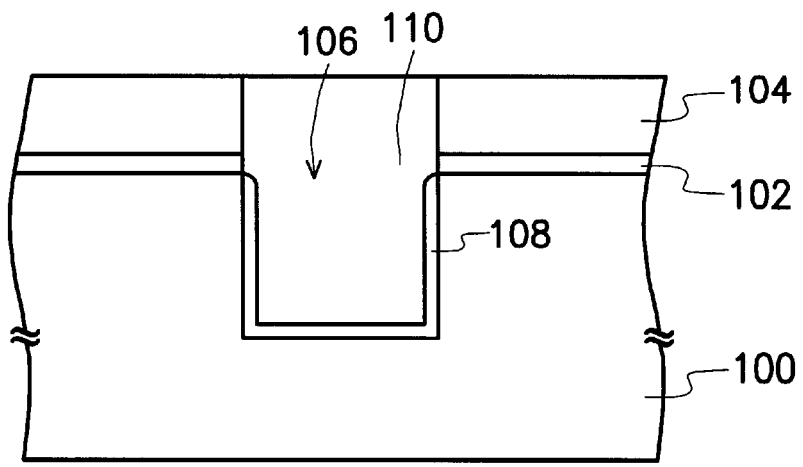
Figure 1C:
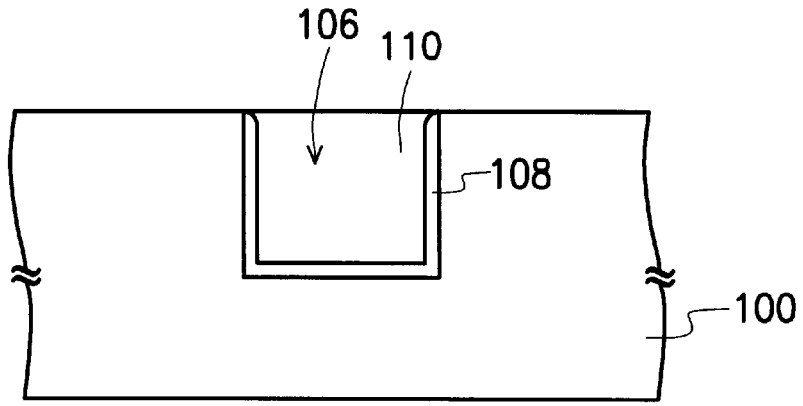

Reference will now be made in detail to the present preferred embodiments of the invention, examples of which are illustrated in the accompanying drawings. Wherever possible, the same reference numbers are used in the drawings and the description to refer to the same or like parts.

Figure 2A:
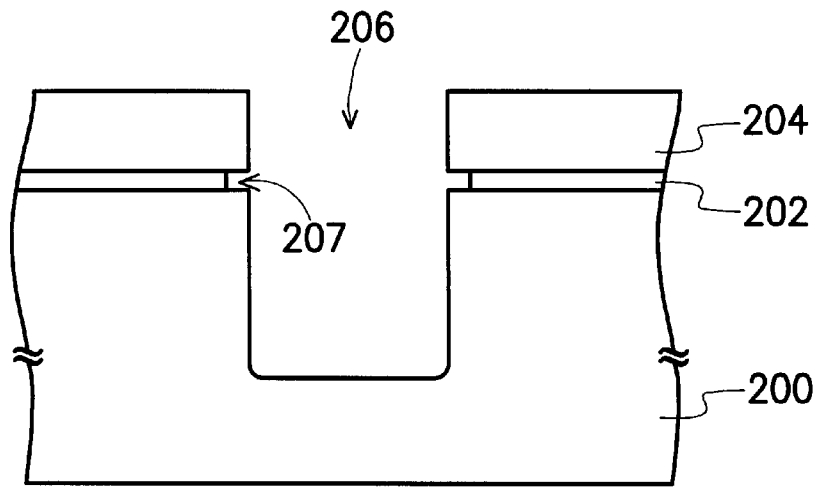
FIGS. 2A–2F are schematic cross sectional views showing the progression of steps for producing a shallow trench isolation structure according to the first preferred embodiments of the invention.

As shown in FIG. 2A, a pad oxide layer 202 and a mask layer 204 are sequentially formed over a substrate 200. The mask layer 204 is preferably a silicon nitride layer. Through a lithographic and etching procedure, portions of the mask layer 204, pad oxide layer 202, and the substrate 200 are removed forming a trench 206 in the substrate 200. After the trench 206 is formed, a wet etching procedure is conducted which removes a portion of the pad oxide layer 202 exposed in the trench 206. Consequently, a recess 207 is formed on the pad oxide layer 202.

Figure 2B:
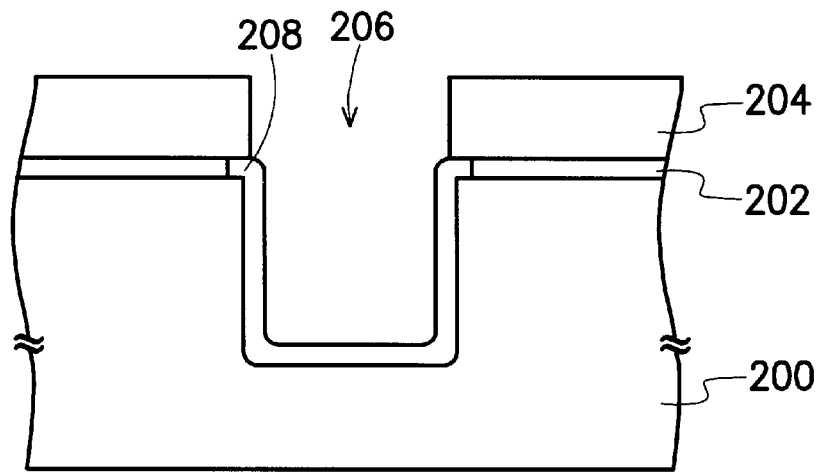

As shown in FIG. 2B, the substrate 200 exposed in the trench 206 is oxidized. Thus, a linear oxide layer 208 is formed on the surface of the substrate 200.

Figure 2C:
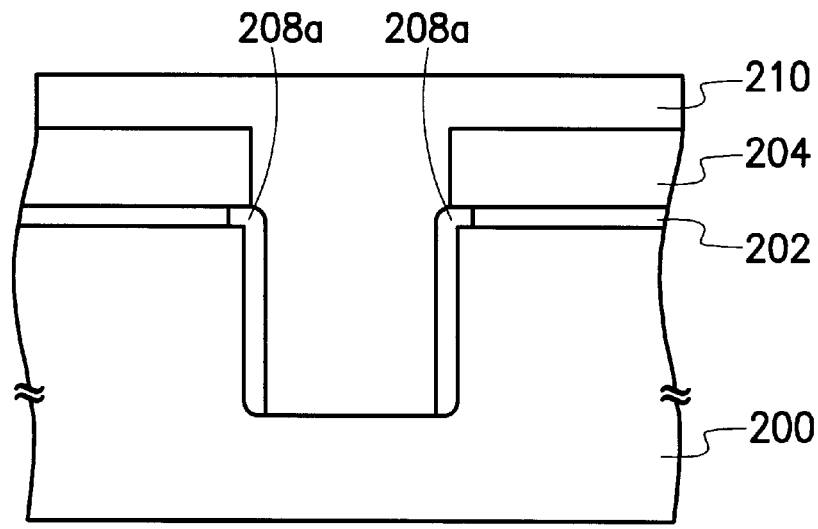

As shown in FIG. 2C, the linear oxide layer 208 at the bottom of the trench 206 is removed to expose the substrate 200 on the bottom of the trench 200. However, the linear oxide 208 remains on the sidewall of the trench 206. The linear oxide 208 is removed through an anisotropic etching procedure such as reactive ion etching (RIE). After exposing the substrate 200 on the bottom of the trench 200, a polysilicon layer 210 is deposited over the mask layer 204 and the trench 206. The polysilicon layer 210 needs to be of a thickness that does not form voids in the trench 206.

Figure 2D:
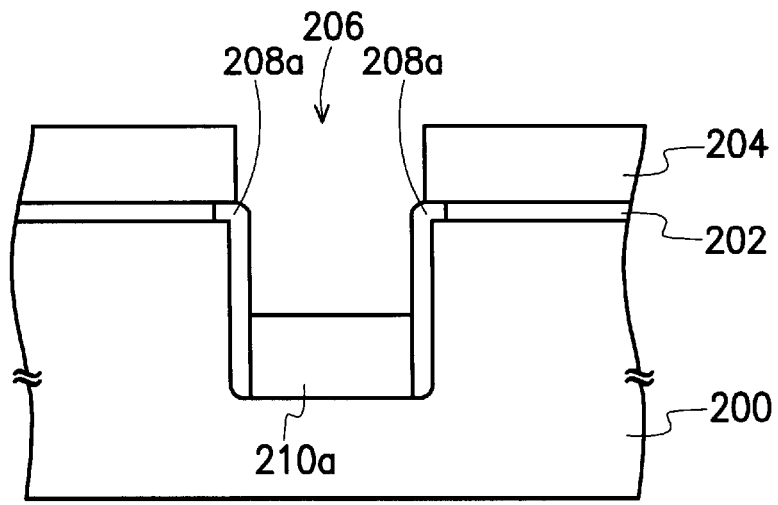

As shown in FIG. 2D, a dry etching procedure or wet etching procedure can be used to remove the polysilicon layer 210 above the mask layer 204. However, when etching is conducted to remove polysilicon 210 on the mask layer 204, the polysilicon layer 210 on the top of the trench 206 is also removed. This etching step forms a polysilicon plug 210a within the trench 206 that makes direct contact with the substrate 200.

Figure 2E:
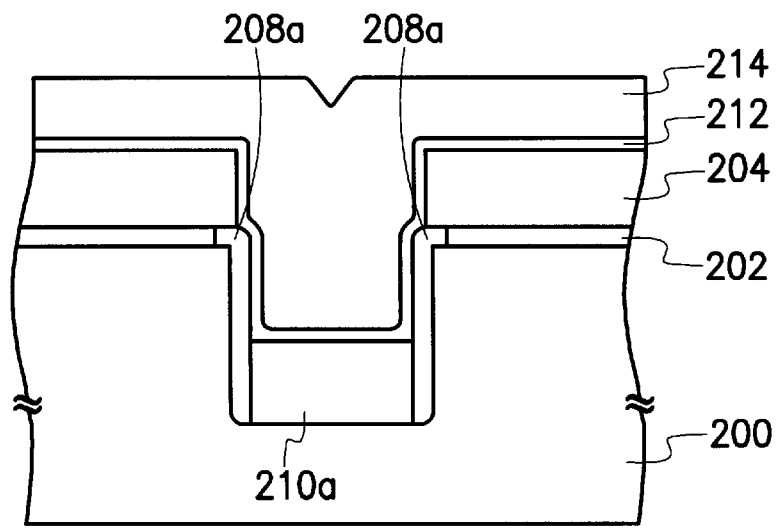
Figure 2F:
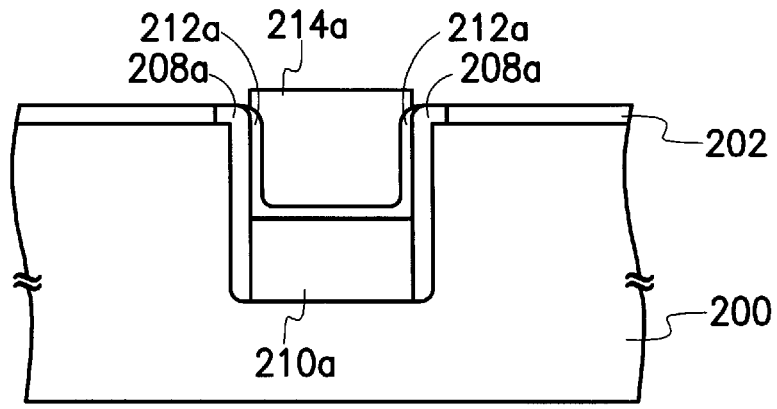

As shown in FIG. 2E, the resultant structure mentioned above is entirely covered by a thin barrier layer 212. The barrier layer 212 is preferably a silicon nitride layer with a thickness of about 30–100 Å. A isolation layer 214 is then deposited over the barrier layer 212. The isolation layer 214 needs to be of a thickness such that it completely fills the trench. The material used for the isolation layer is preferably silicon dioxide. High Density Plasma Enhanced Chemical Vapor Deposition, for example, can be used to form the isolation layer 214.

The barrier layer 212 above the silicon plug 210a prevents the spread of oxide vapors from entering the polysilicon plug 210a creating an oxide reaction. Polysilicon oxidation causes the formation of silicon oxide, which causes an increase in volume. Changes in volume can affect the performance of the device. Thus, the presence of the barrier layer 212, silicon and silicon dioxide, add varying amounts of stress. Thus, the barrier layer should not be too thick.

As shown in 2F, the isolation layer 214 and the barrier layer 212 above the mask layer 204 and outside the trench 206 are removed leaving the isolation layer 214a filling the trench 206. This step is preferably performed by a mechanical chemical method.

The mask layer 204 is then removed. If the material of the mask layer 204 is silicon nitride, etching, for example, a wet etching procedure using hot phosphoric acid can be used to remove the mask layer 204. Moreover, since the materials of the barrier layer 212 and the mask layer 204 are similar, the barrier layer 212 on the sidewall of the mask layer 204 is also removed.

In the method of shallow trench isolation provided in this invention, the trench is filled with a polysilicon plug, which lowers the aspect ratio of the trench used to fill the isolation material. Thus, difficulties associated with the use of isolation material to fill the trench are reduced. A linear oxide layer is formed on the sidewall of the trench, which also provides isolation. Hence, concern that isolation has been reduced due to the shallowness of the isolation layer is unnecessary.

In addition, an etching step to remove the linear oxide layer at the bottom of the trench, needs to be conducted after the formation of the linear oxide layer in the trench. The purpose of this step is to make sure that the silicon plug filling the trench is in direct contact with the substrate. Thus, when an electrical operation occurs floating is prevented because the substrate, which is grounded, has the same voltage as the silicon plug.

In the conventional method, oxidation of polysilicon used to fill the trench may occur in subsequent stages of the process. The silicon dioxide, formed as a result of oxidation, possesses greater volume. This change in volume produces a great deal of stress on the device and affects its performance. Thus, the method of this invention provides a barrier layer covering the polysilicon layer and formed between the barrier layer and the isolation layer. In this way, further oxidation of the polysilicon layer and overly high stress are prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a shallow trench isolation structure, comprising:

providing a substrate with a trench therein;

forming a linear oxide layer on exposed surfaces of the substrate within the trench;

removing the linear oxide layer at the bottom of the trench leaving the linear oxide layer on the sidewall of the trench;

forming a polysilicon plug that partially fills the trench;

forming a barrier layer covering the polysilicon plug and the substrate;

forming a isolation layer above the barrier layer to fill the trench; and removing the isolation layer and the barrier layer outside the trench.

2. The process of claim 1, wherein the linear oxide layer is formed by thermal oxidation.

3. The process of claim 1, wherein the linear oxide layer on the bottom of the trench is removed by a reactive ion etching (RIE) step.

4. The process of claim 1, wherein the barrier layer includes a silicon nitride layer.

5. The process of claim 1, wherein a thickness of the barrier layer is between 30 and 100 Å.

6. The process of claim 1, wherein the isolation layer and the barrier layer outside the trench is removed by a chemical mechanical polishing method.

7. A method for manufacturing a shallow trench isolation structure, comprising:

providing a substrate;

sequentially forming a pad oxide layer and a mask layer over the substrate;

removing portions of the mask layer, the pad layer and the substrate, forming a trench;

removing an exposed part of the pad oxide layer within the trench which creates a recess on a remaining part of the pad oxide layer and between mask layer and the substrate;

forming a linear oxide layer covering the substrate exposed in the trench;

removing the linear oxide layer at a bottom of the trench to expose a portion of the substrate;

forming a polysilicon layer that covers the mask layer and fills the trench;

removing the polysilicon layer higher than the mask layer to form a polysilicon plug in the trench;

forming a silicon nitride layer that covers the polysilicon plug and the mask layer;

forming a isolation layer above the silicon nitride layer to fill the trench;

removing the isolation layer, the silicon nitride layer, and the mask layer above the pad layer forming a shallow trench isolation structure.

8. The process of claim 7, wherein the linear oxide layer is formed by a thermal oxidation method.

9. The process of claim 7, wherein the step of removing linear oxide at the bottom of the trench is an reactive ion etching (RIE) method.

10. The process of claim 7, wherein the step of removing polysilicon to form a polysilicon plug includes etching.

11. The process of claim 7, wherein a thickness of the silicon nitride is between 30 and 100 Å.

12. The process of claim 7, wherein the step of removing linear oxide above the substrate and outside the trench is a chemical mechanical polishing method.

* * * * *